(12) United States Patent
Govar et al.

(10) Patent No.: US 10,804,839 B1
(45) Date of Patent: *Oct. 13, 2020

(54) SOLAR PANEL DEPLOYMENT METHOD

(71) Applicants: Clint Justin Govar, Fredericksburg, VA (US); Evan Thomas Rule, Burtonsville, MD (US); Eric Bennet Shields, Reston, VA (US); Anthony C. Suggs, Silver Spring, MD (US); Richard Patrick Hardy, Dickerson, MD (US)

(72) Inventors: Clint Justin Govar, Fredericksburg, VA (US); Evan Thomas Rule, Burtonsville, MD (US); Eric Bennet Shields, Reston, VA (US); Anthony C. Suggs, Silver Spring, MD (US); Richard Patrick Hardy, Dickerson, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 164 days.

This patent is subject to a terminal disclaimer.

(21) Appl. No.: 16/034,112

(22) Filed: Jul. 12, 2018

Related U.S. Application Data

(62) Division of application No. 13/017,265, filed on Jan. 31, 2011, now Pat. No. 10,024,579.

(Continued)

(51) Int. Cl.
*H02S 30/20* (2014.01)
*H02S 10/40* (2014.01)

(Continued)

(52) U.S. Cl.
CPC ............ *H02S 30/20* (2014.12); *H01L 31/042* (2013.01); *H02S 10/40* (2014.12); *H02S 20/30* (2014.12); *H02S 30/10* (2014.12)

(58) Field of Classification Search
CPC .......... H02S 30/20; H02S 30/10; H02S 20/30; H02S 10/40; H01L 31/042
See application file for complete search history.

(56) References Cited

U.S. PATENT DOCUMENTS

| 5,522,943 | A | * | 6/1996 | Spencer | ................ | H01L 31/042 136/245 |
| 6,201,181 | B1 | * | 3/2001 | Azzam | .................... | H02S 20/30 136/244 |

(Continued)

*Primary Examiner* — David J Laux
(74) *Attorney, Agent, or Firm* — Howard Kaiser

(57) ABSTRACT

The present invention typically features integrative configurability for transportation/storage, and disintegrative configurability for operation. Two half-cases are coupled to obtain a case. A case is uncoupled to obtain two half-cases. Each half-case houses a solar panel (pivotably connected to the half-case) and a U-bar (pivotably connected to the solar panel). The solar panel is pivoted away from the half-case's interior to the angle-of-inclination desired for collecting solar energy. The U-bar is pivoted away from the solar panel's back to securely fit into one of plural parallel slots provided across the half-case's interior, the U-bar thereby holding the solar panel in place at the desired angle-of-inclination. The half-cases are laid flat individually to collect solar energy. A half-case is "compacted" by pivoting the U-bar proximate the solar panel's back and pivoting the solar panel proximate the half-case's interior. Two complementary half-cases, each compacted, are (re)attached to form a portable case.

14 Claims, 13 Drawing Sheets

Related U.S. Application Data

(60) Provisional application No. 61/300,383, filed on Feb. 1, 2010.

(51) Int. Cl.
*H02S 30/10* (2014.01)
*H02S 20/30* (2014.01)
*H01L 31/042* (2014.01)

(56) References Cited

U.S. PATENT DOCUMENTS

| | | | | |
|---|---|---|---|---|
| 6,650,085 B2* | 11/2003 | Lau | ............... | H02S 10/40 |
| | | | | 320/101 |
| 6,737,573 B2* | 5/2004 | Yeh | ............... | H02S 30/20 |
| | | | | 136/244 |
| 6,870,089 B1* | 3/2005 | Gray | ............... | H02S 10/40 |
| | | | | 136/251 |
| 10,024,579 B1* | 7/2018 | Govar | ............... | F24S 80/00 |
| 2010/0229919 A1* | 9/2010 | Benatar | ............... | A45C 5/03 |
| | | | | 136/246 |

\* cited by examiner

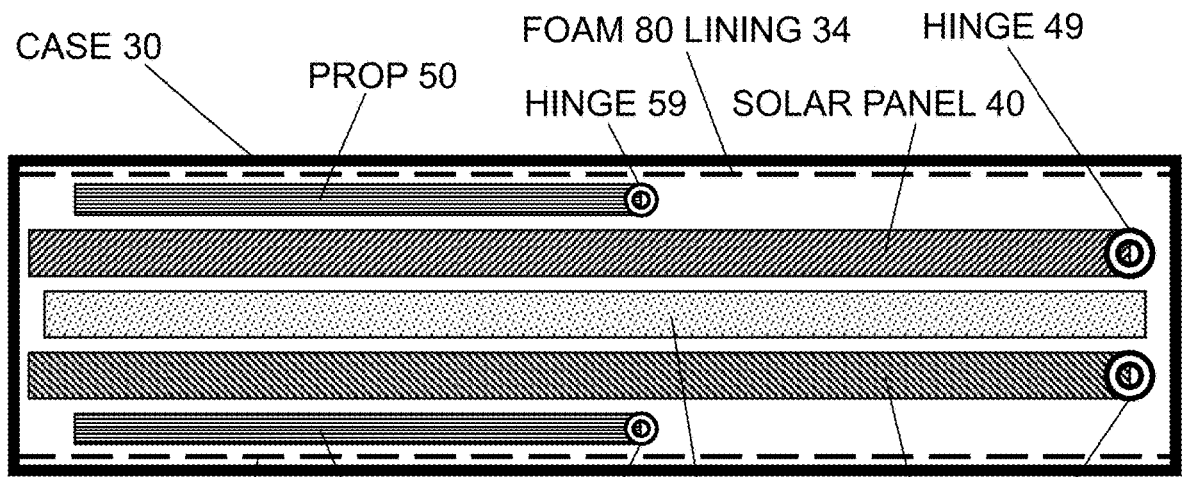
FIG. 8
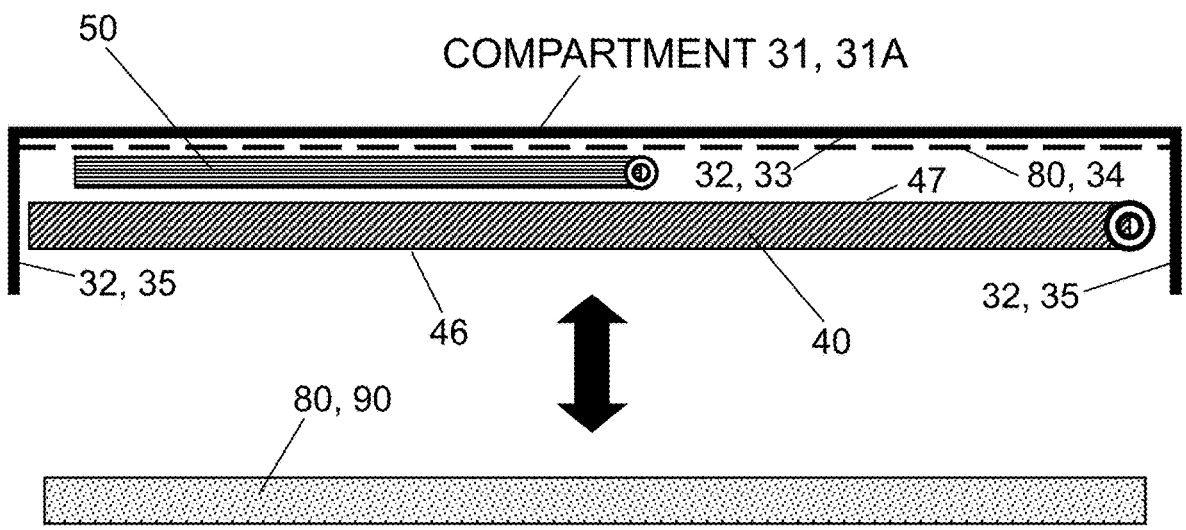
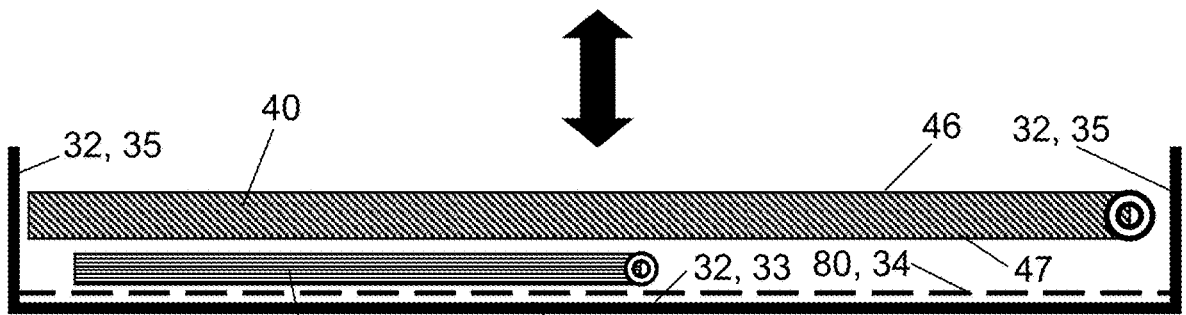
FIG. 9

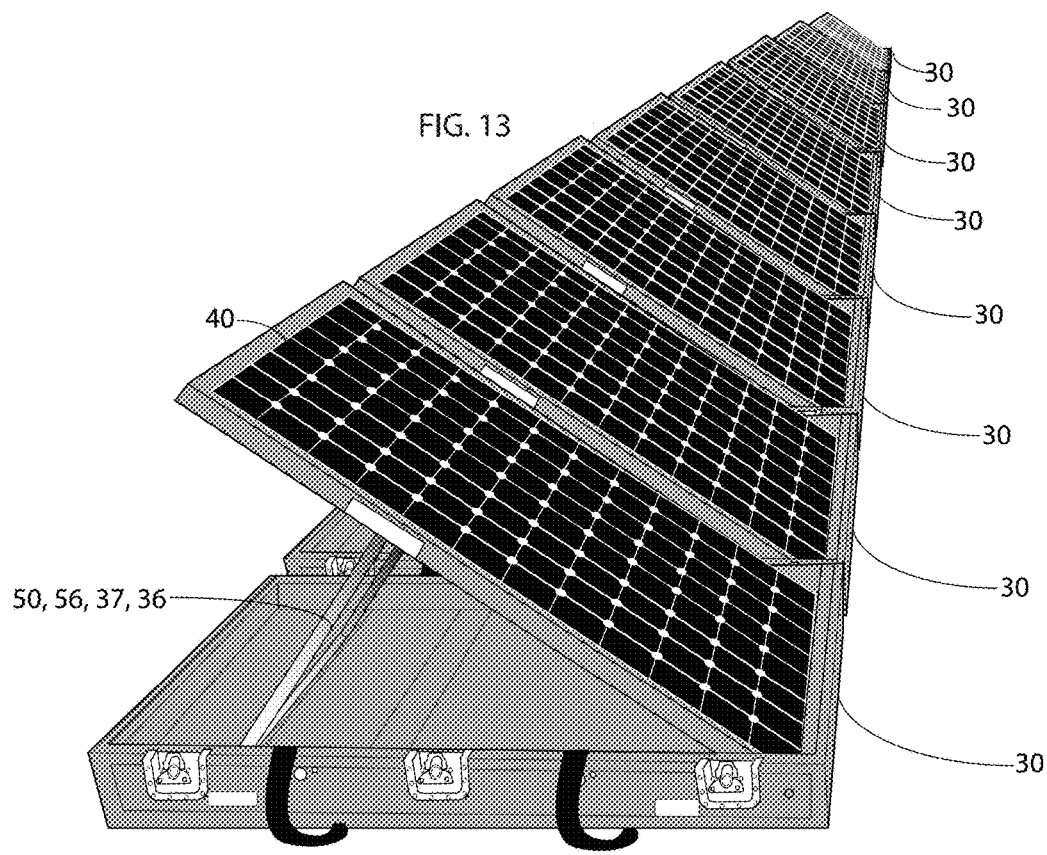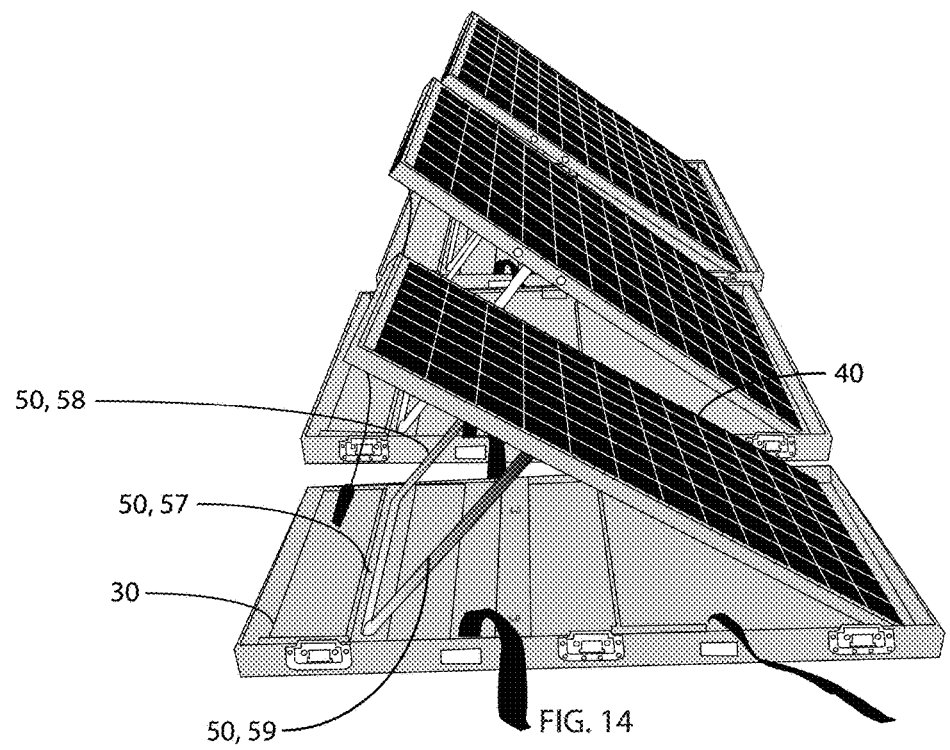

SOLAR PANEL DEPLOYMENT METHOD

CROSS-REFERENCE TO RELATED APPLICATIONS

This application is a divisional of U.S. nonprovisional patent application Ser. No. 13/017,265, hereby incorporated herein by reference, application filing date 31 Jan. 2011, title "Solar Panel Deployment System," joint inventors Clint Justin Govar, Evan Thomas Rule, Eric Bennet Shields, Anthony C. Suggs, and Richard Patrick Hardy, now U.S. Pat. No. 10,024,579, patent issue date 17 Jul. 2017, which claims the benefit of U.S. provisional application No. 61/300,383, filed 1 Feb. 2010, hereby incorporated herein by reference, entitled "Solar Panel Deployment System," joint inventors Clint Justin Govar, Evan Thomas Rule, Eric Bennet Shields, Anthony C. Suggs, and Richard Patrick Hardy.

BACKGROUND OF THE INVENTION

The present invention relates to solar energy, more particularly to methods and devices for collecting solar energy, such as involving use of solar panels for photovoltaically generating electricity.

The military has considered implementing renewable energy systems to mitigate risk and to reduce logistical fuel burdens on deployed troops. Solar power has been regarded as a prime candidate as a renewable energy source that is capable of being readily deployed and of significantly ameliorating demand for logistical fuel. A major obstacle to utilizing this free source of energy is the harsh military environment to which delicate (e.g., silicon-based) solar panels are to be exposed. The widespread use of solar panels in the field has been further impeded by practical difficulties attendant the transport (e.g., shipping and storage) and rapid deployment of solar collection systems. It is therefore desirable to devise a better methodology for transporting and rapidly deploying solar panels and for using same in harsh environments.

SUMMARY OF THE INVENTION

In view of the foregoing, it is an object of the present invention to provide an improved methodology for collecting solar energy "in the field."

The present invention is typically embodied as an apparatus for collecting solar energy. The inventive apparatus comprises a pair of containers, a pair of solar modules, and a pair of U-shaped support members. The containers each have an inside container surface and an outside container surface and plural alignments of at least two brackets mounted on the inside container surface. The solar modules are each pivotably connected to a container. The U-shaped support members are each pivotably connected to a solar module.

Each solar module is capable of a pivot-down module position or plural pivot-up module positions. The pivot-down module position is next to the corresponding container. Each pivot-up module position is distanced from the corresponding container. Each U-shaped support member is capable of a pivot-down member position or plural pivot-up member positions. The pivot-down member position is next to the corresponding solar module. Each pivot-up member position is distanced from the corresponding solar module. The containers are joinable to each other so as to enclose the solar modules in the pivot-down module position and the U-shaped support members in the pivot-down member position.

The containers are separable from each other for independent deployment of each solar module according to which the outside container surface is placed upon an area. Each solar module is deployable in either the pivot-down module position or a pivot-up module position. According to deployment of the solar module in the pivot-down module position, the U-shaped support member is in the pivot-down member position. According to deployment of the solar module in a pivot-up module position, the U-shaped support member is in a pivot-up member position and is slotted in an alignment of at least two brackets.

According to typical inventive practice, the present invention represents a rapidly deployable solar collection device that uniquely incorporates shipping and packaging into function. The present invention provides a solar energy collection device that is portable, rugged, and durable and that is configured for fast and easy deployment. The inventive device uniquely lends itself to being safely transported and rapidly deployed and then reliably operated in a harsh environment such as may characterize a military arena.

According to typical embodiments of the present invention, a case is sized for a pair of selected solar panels, and can be pre-outfitted with foam. Each case includes two case compartments (open case components). Each case compartment holds a solar panel, which deploys directly out of the case compartment, which serves as a base during deployment. Depending on factors including the size and weight of each case, the cases can be taken directly to the deployment site and opened, or the cases can be opened and separated into the two "halves" (not necessarily "half" and "half" in a dimensional sense), i.e., the two compartments, before being moved to the deployment site.

In accordance with some inventive embodiments, the solar panel is lifted up to the appropriate angle via a pair of hinging mechanisms that fasten the sides of the solar panel, in the vicinity of its front edge, directly to the sides of the case compartment enclosing the solar panel. Thus hinged by two pull-pins respectively engaged at its two corners, the solar panel is rotatable upward or downward. The solar panel unfolds out of the open "box" (case compartment) with its other end (i.e., the end opposite its hinged end) rotating/pivoting upward. In order to be set in place, the solar panel is supported by a U-shaped bar, which is made for example of a strong, lightweight material such as a metallic (e.g., aluminum) or composite material. The U-shaped bar is hingedly connected to the solar panel at its non-solar side, and can be locked in multiple discrete locations that correspond with the predetermined panel angles.

Other objects, advantages, and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein like numbers indicate same or similar parts or components, and wherein:

FIG. 1 through FIG. 9 show the case ("suitcase") in a closed condition (FIG. 1, FIG. 2, FIG. 3, FIG. 5, FIG. 6) or an opened condition (FIG. 4, FIG. 7), in accordance with various embodiments of the present invention. Each case includes two semi-case components, which can be joined (e.g., fastened together to form the case) and separated (e.g., unfastened to yield the separate semi-case components).

FIG. 10 through FIG. 23 show deployment of the solar panel in accordance with various embodiments of the present invention. Each of FIGS. 10 through 23 shows at least one solar panel deployed at a predetermined fixed oblique angle with respect to the generally horizontal foundation on which the semi-case component rests.

FIG. 23 additionally shows a solar panel that is not propped up at an oblique angle; that is, the solar panel as deployed remains approximately horizontal in accordance with the generally horizontal foundation.

FIGS. 16 through 18 particularly show some detail of the hinged connection of the solar panel to the semi-case component.

FIG. 19 particularly shows some detail of the hinged connection of the U-shaped prop to the semi-case component.

FIGS. 20 through 22 particularly show some detail of the slotting of the U-shaped prop in a groove/slot provided in foam lining the semi-case component's inner wall, and the locking of the transverse portion of the U-shaped prop via locking brackets mounted in the groove/slot.

Figure 1:
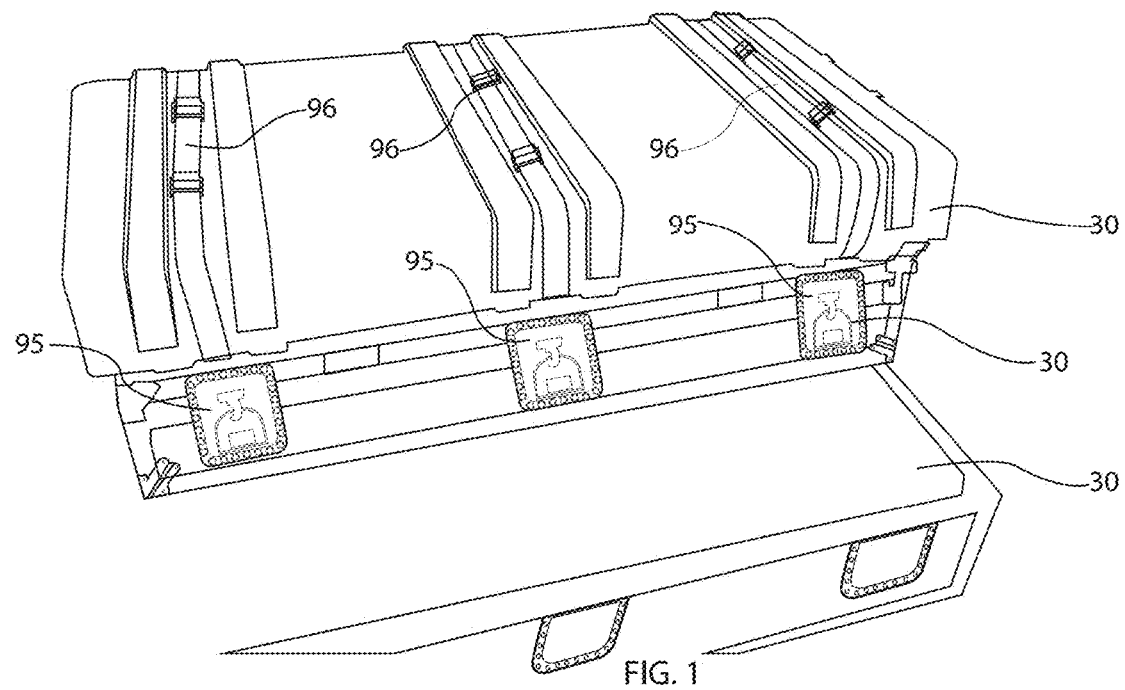

DESCRIPTION OF EXEMPLARY
EMBODIMENTS OF THE INVENTION

Referring now to the figures, the present invention's solar collection device, as typically embodied, includes a case 30, two solar panels 40, and two U-shaped bars 50. As shown in FIGS. 8 and 9, the case 30 includes and is separable into a pair of complementary main parts 31, viz., 31a and 31b, referred to herein as "compartments" or "open case components" or "semi-case components" or "half-case components." The open case components 31 are attachable to and detachable from each other and represent halves or semi-sections of the case 30. The terms "half" and "semi" as used herein to refer to the present invention's open case components are not intended to suggest that two joinable components necessarily are congruent or equally dimensioned, but rather to suggest that, according to typical inventive practice, they are major, comparable, and complementary components.

Particularly with reference to FIGS. 1 through 9, case 30 describes a rectangular parallelepiped and has length L, width W, and height H. Each open case component 31 describes a rectangular parallelepiped and has length L, width W, height h, and a lengthwise-widthwise edge 35. Open case compartment 31a has height ha and lengthwise-widthwise edge 35a. Open case compartment 31b has height hb and lengthwise-widthwise edge 35b. Case 30 and open case compartments 31a and 31b each have the same length L and the same width W. Height ha and height hb combine in a heightwise direction to equal height H. Case 30 is formed by the attachment of open case compartments 31a and 31b whereby lengthwise-widthwise edge 35a and lengthwise-widthwise edge 35b adjoin (e.g., border upon) each other. At least one fastener 95 is used to fasten open case compartments 31a and 31b to form case 30, and to unfasten open case compartments 31a and 31b so that they are separable.

Featured by typical inventive practice is the deployment of a solar panel 40 at a fixed angle using a U-shaped bar 50 in combination with a pivot 49 mounted to the solar panel 40 and brackets 38 mounted to the interior 32 of the case 30 (more specifically, to the bottom face 33 of the interior 32 of the case component 31). The U-shaped bars 50 are also referred to herein as "props" or "stands," because each U-shaped bar 50 serves the function of propping up or standing up the solar panel 40 to which it is hinged.

Figure 6:
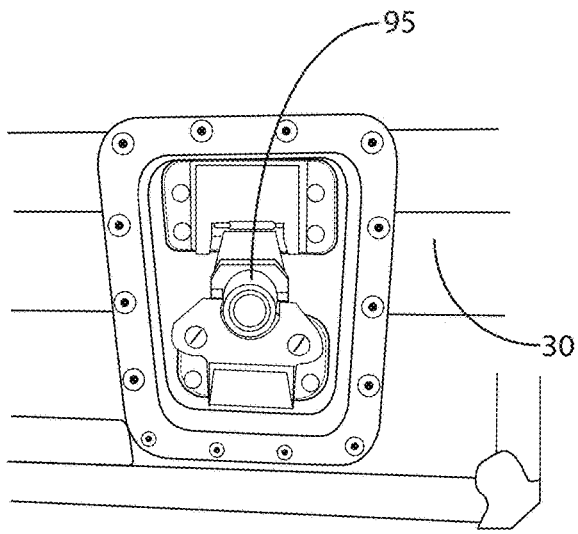
Figure 7:
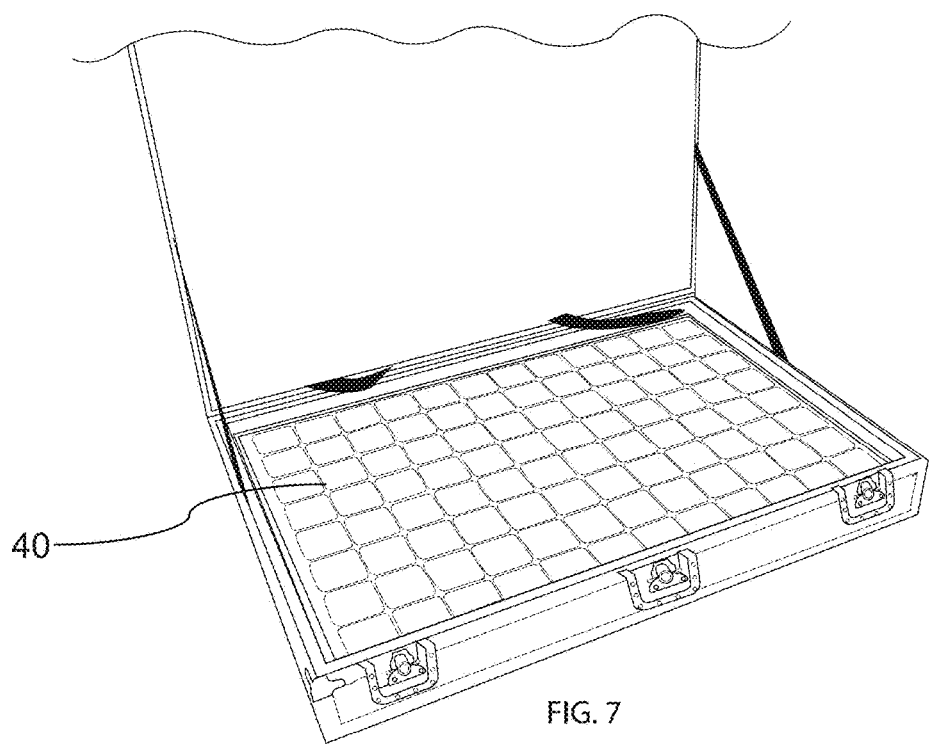
Figure 10:
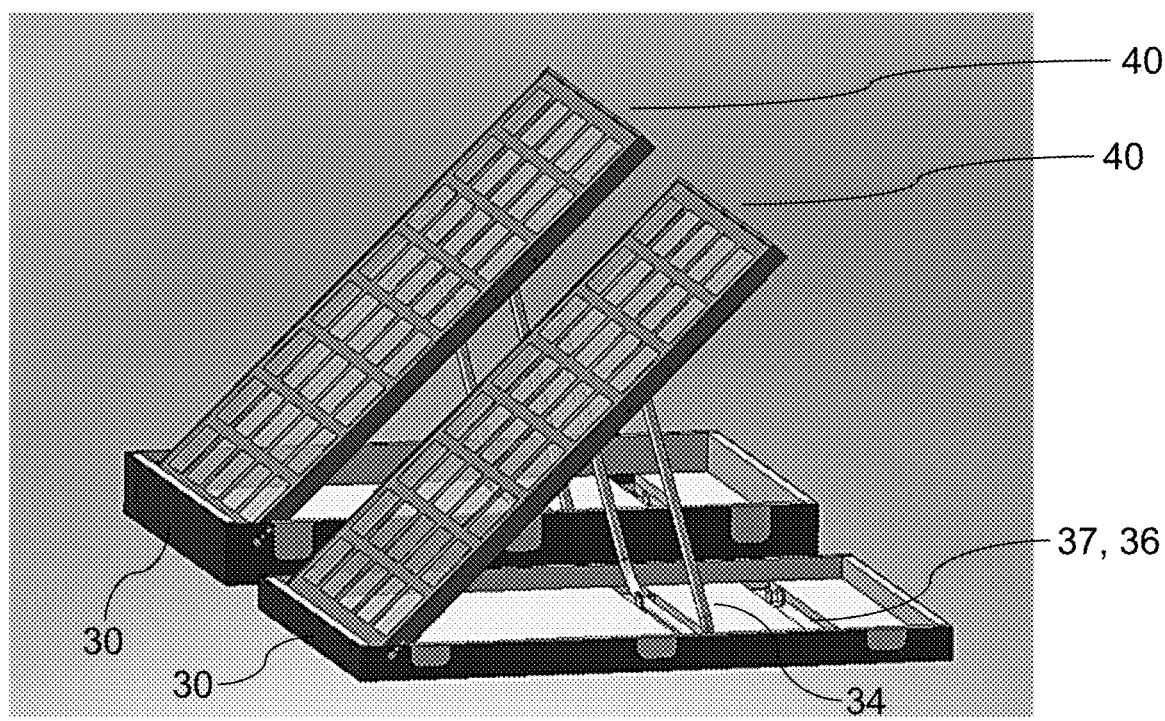
Figure 11:
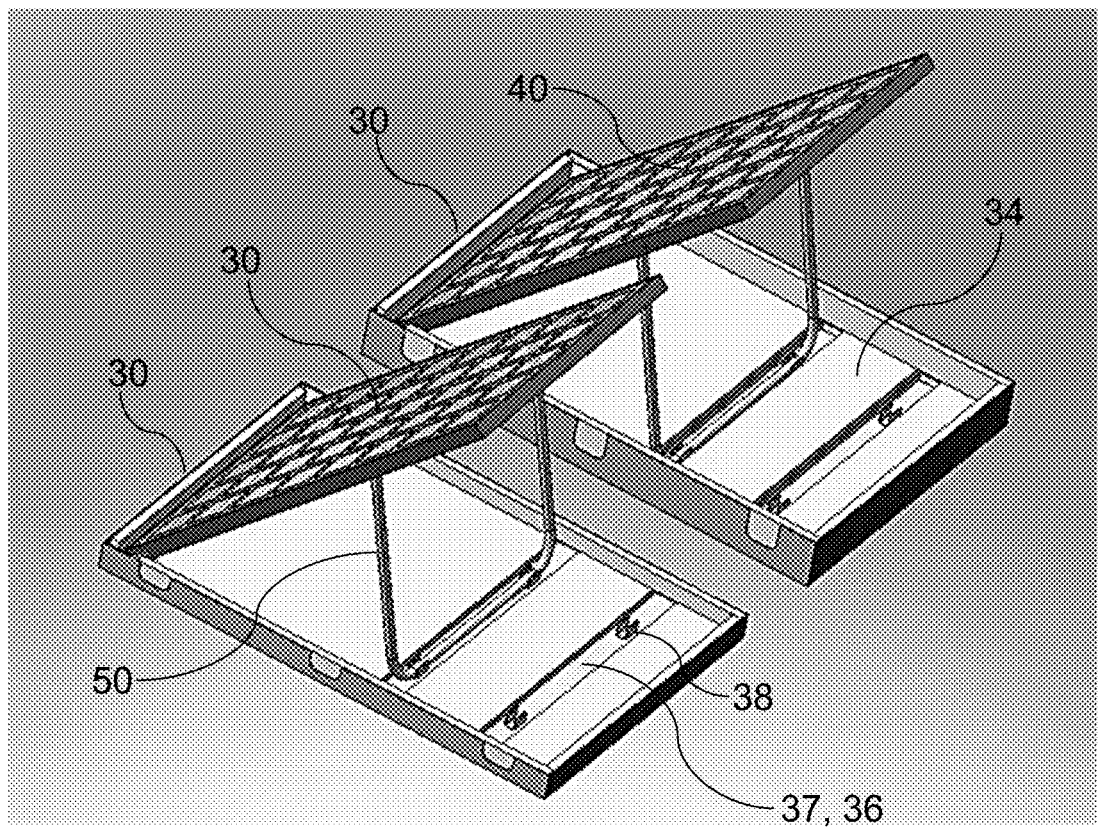
Figure 12A:
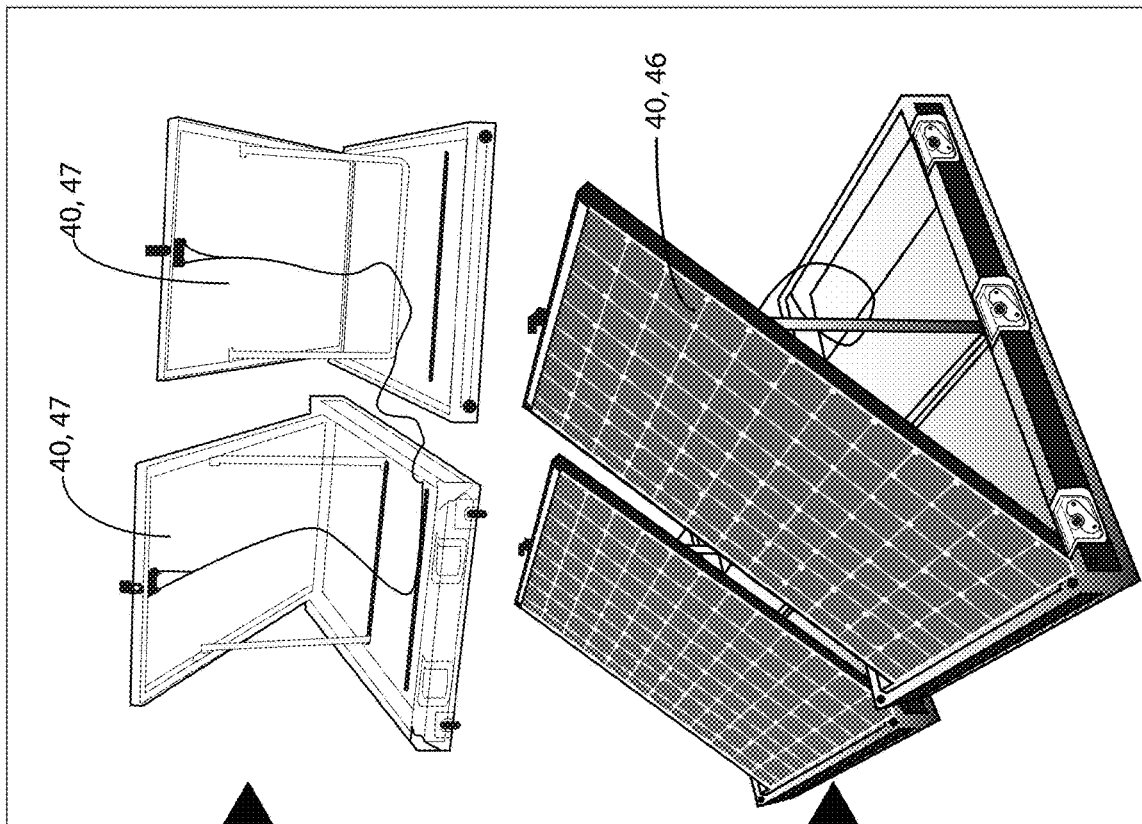
Figure 12:
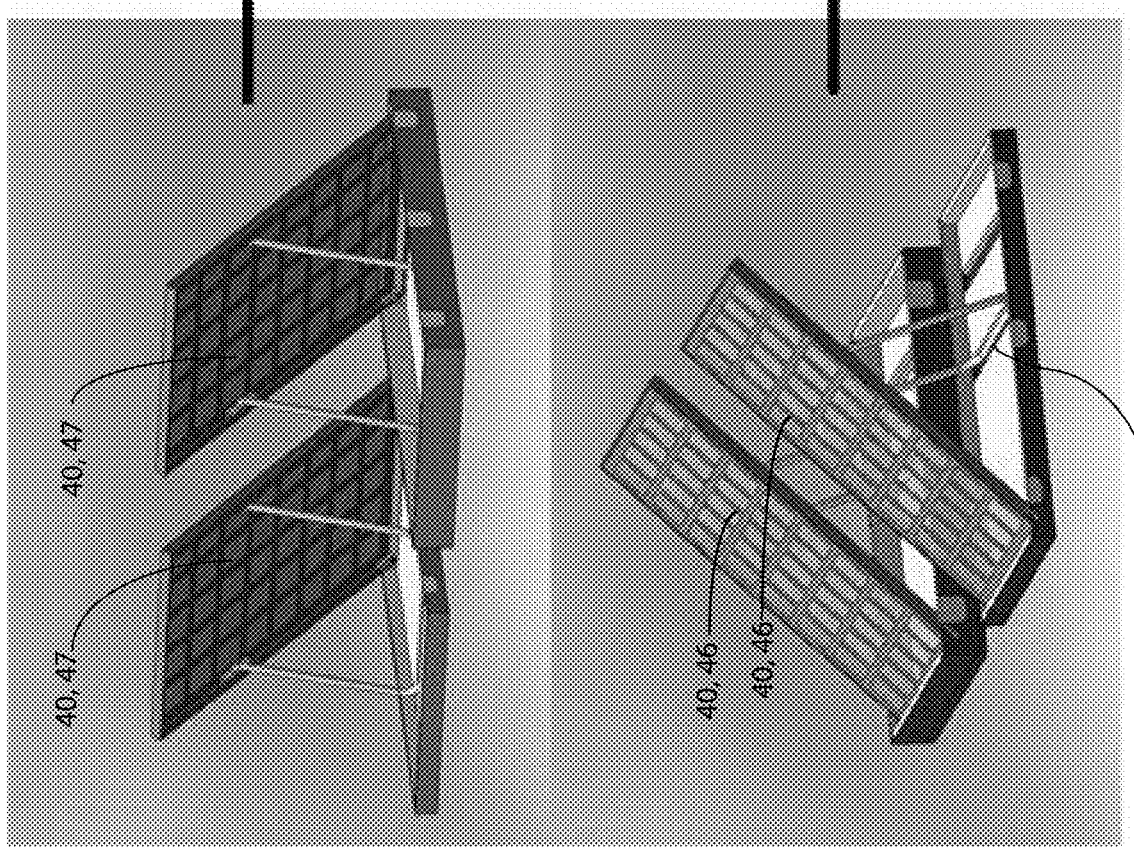
Figure 15:
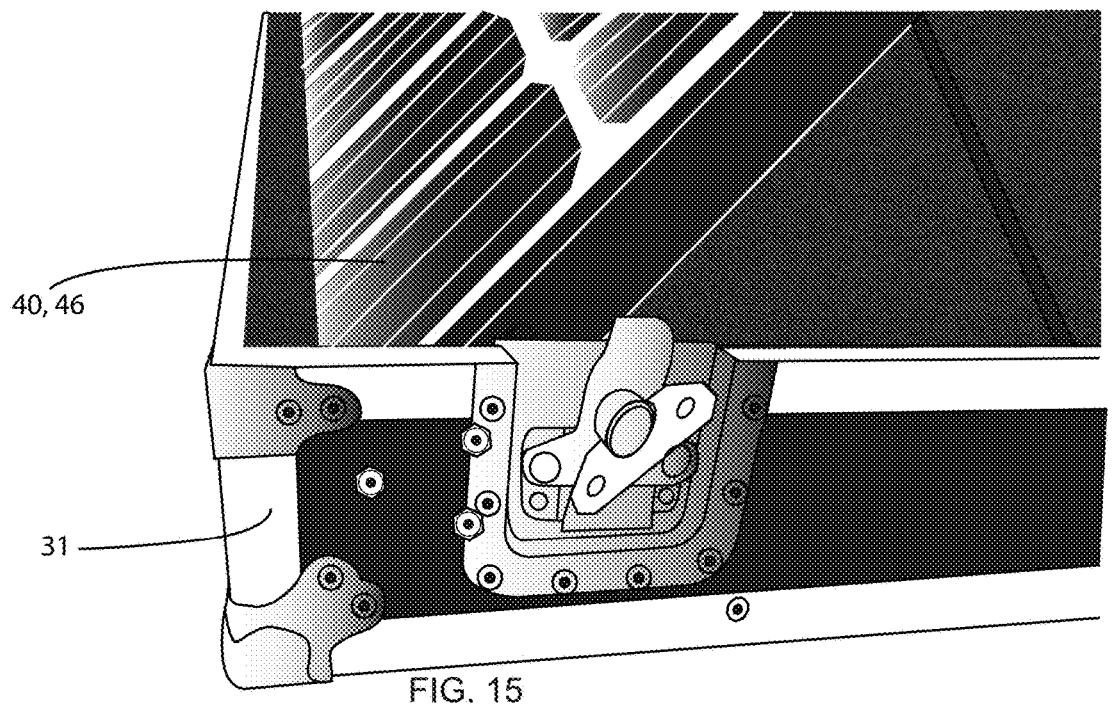
Figure 16:
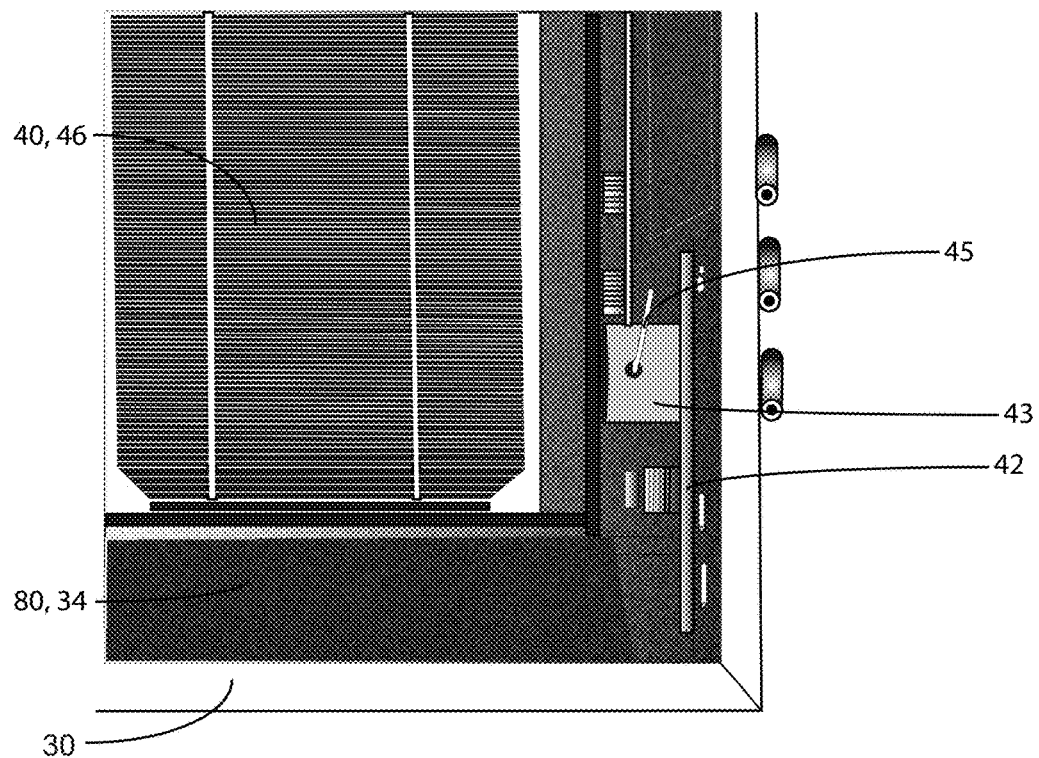

According to frequent inventive practice, the case 30 is at least partially lined with impact-absorbent material (e.g., foam) 80 to provide protection for the solar panels 40 during shipping and transit. Possible case types that can be used for inventive practice include rectangular clam-shell styles and hinged styles. A case 30 can be held together using mechanical fasteners 95 and/or straps 96 that wrap around both open case components, such as shown in FIG. 1 and FIG. 6. By way of example, in testing their invention the present inventors found that a particular hinged style case was more durable than a particular clam-shell style case, and was a better option for deployment and field operation.

Figure 17:
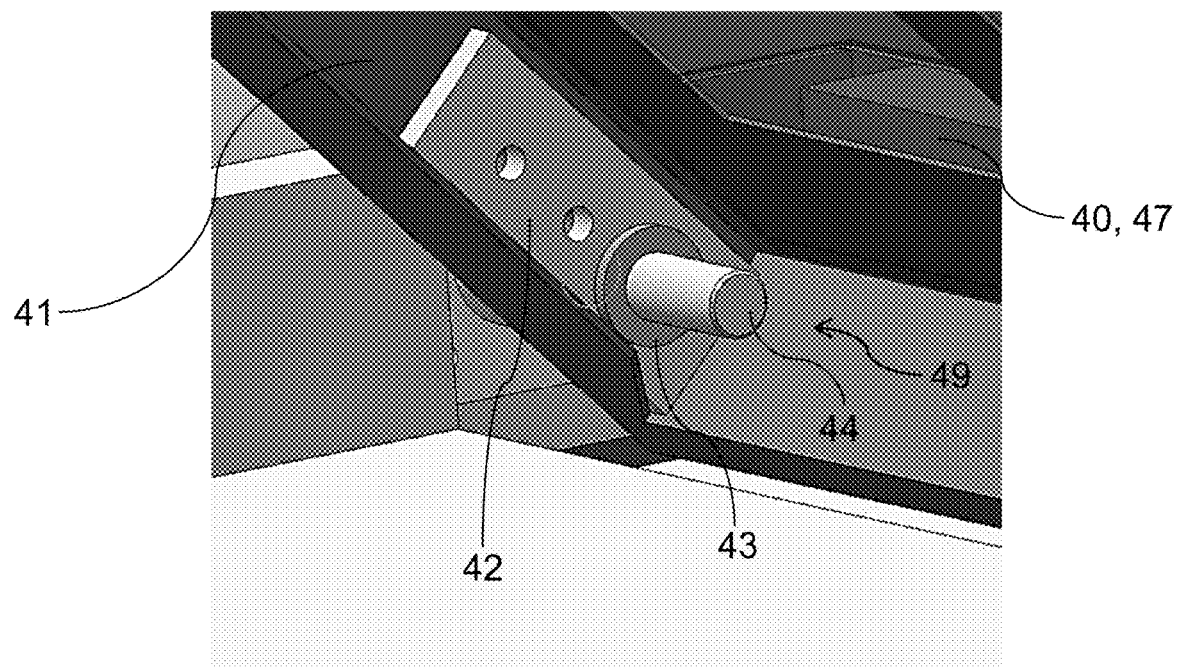
Figure 18:
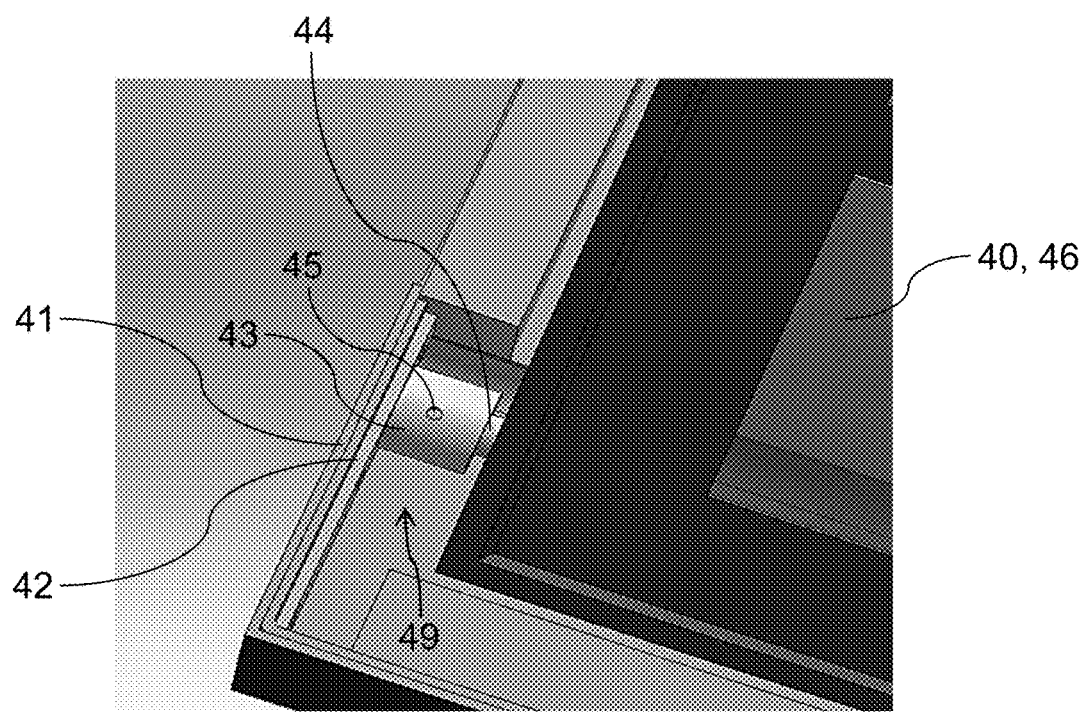

Each open case component 31 has a solar panel 40 rotatably connected thereto (e.g., hingedly attached via a pair of panel-pivoting mechanisms 49, typically at or near one end of the open case component 31). For instance, with reference to FIG. 17 and FIG. 18, the two axially aligned panel-pivoting mechanisms 49 are provided proximate the non-solar side 47 of a solar panel 40 at the two inside opposite side surfaces 41 of solar panel 40. Each inside opposite side surface 41 can have a panel-pivoting mechanism 49 including a metal (e.g., aluminum) plate 42 riveted thereto (e.g., for strengthening/reinforcement), a bored-out cylinder 43 welded to the plate 42, a hinge pin 44 provided through the cylinder bore 43, and a cotter pin 45 to prevent axial displacement of the hinge pin 44.

Figure 19:
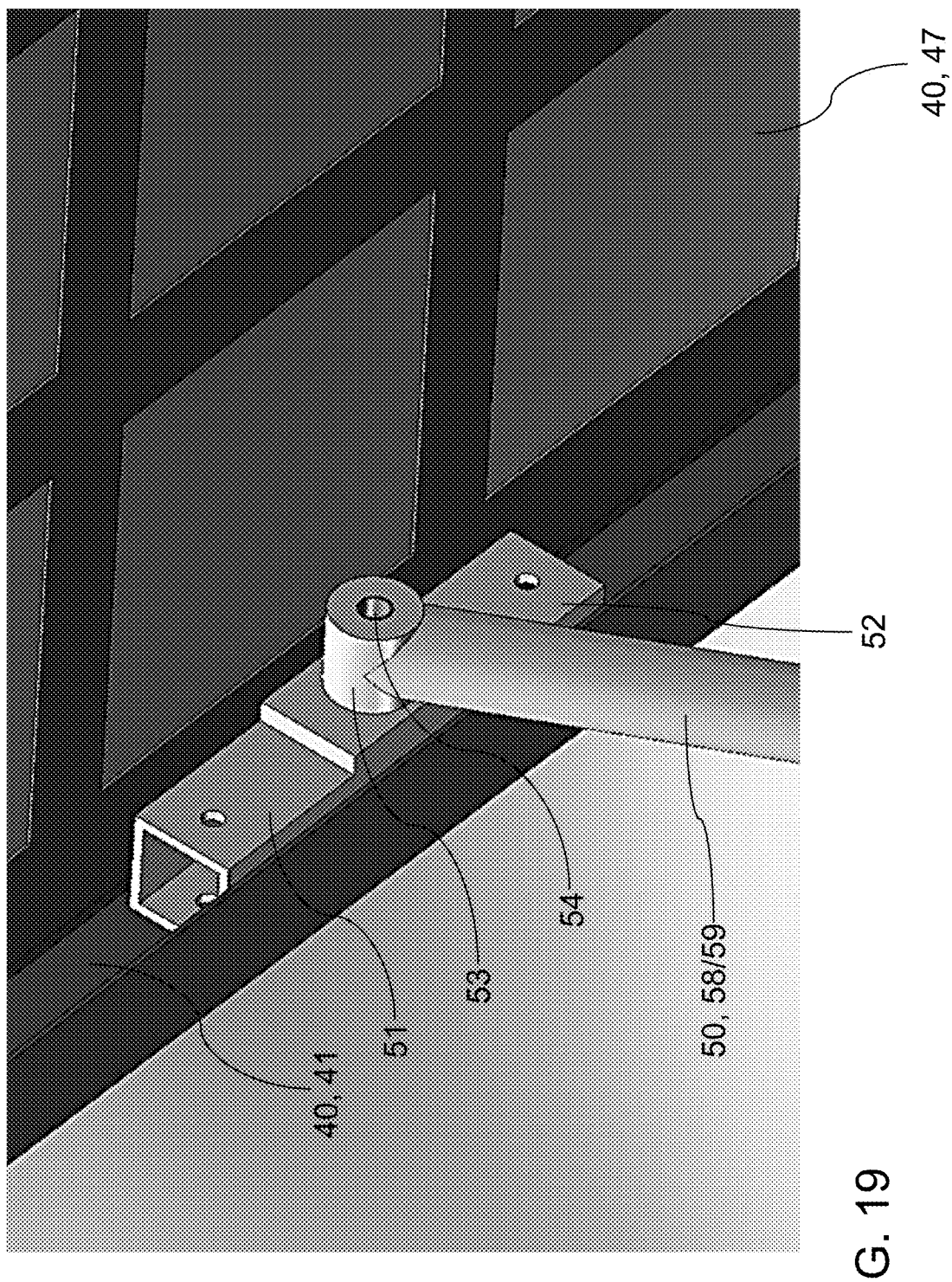

Each solar panel 40 has a U-shaped bar 50 rotatably connected thereto, e.g., hingedly attached via a pair of axially aligned bar-pivoting mechanisms 59, typically distanced from both ends of the solar panel 40, but closer to one end. Particularly referring to FIG. 19, each pivoting mechanism 59 for the U-shaped bar 50 can include, for instance, a threaded metal (e.g., aluminum) rectangular piece 51 and a metal plate 52 attached thereto (e.g., for strengthening/reinforcement). The U-shaped bar 50 can have attached at both ends a threaded cylindrically shaped member (like a bushing) 53. A bolt (e.g., a shoulder bolt) 54, can be threaded through the U-shaped bar 50's bushing-like member 43, the rectangular piece 51, and the plate 52 so that the U-shaped bar 50's bushing-like member 53 can pivot.

Figure 21:
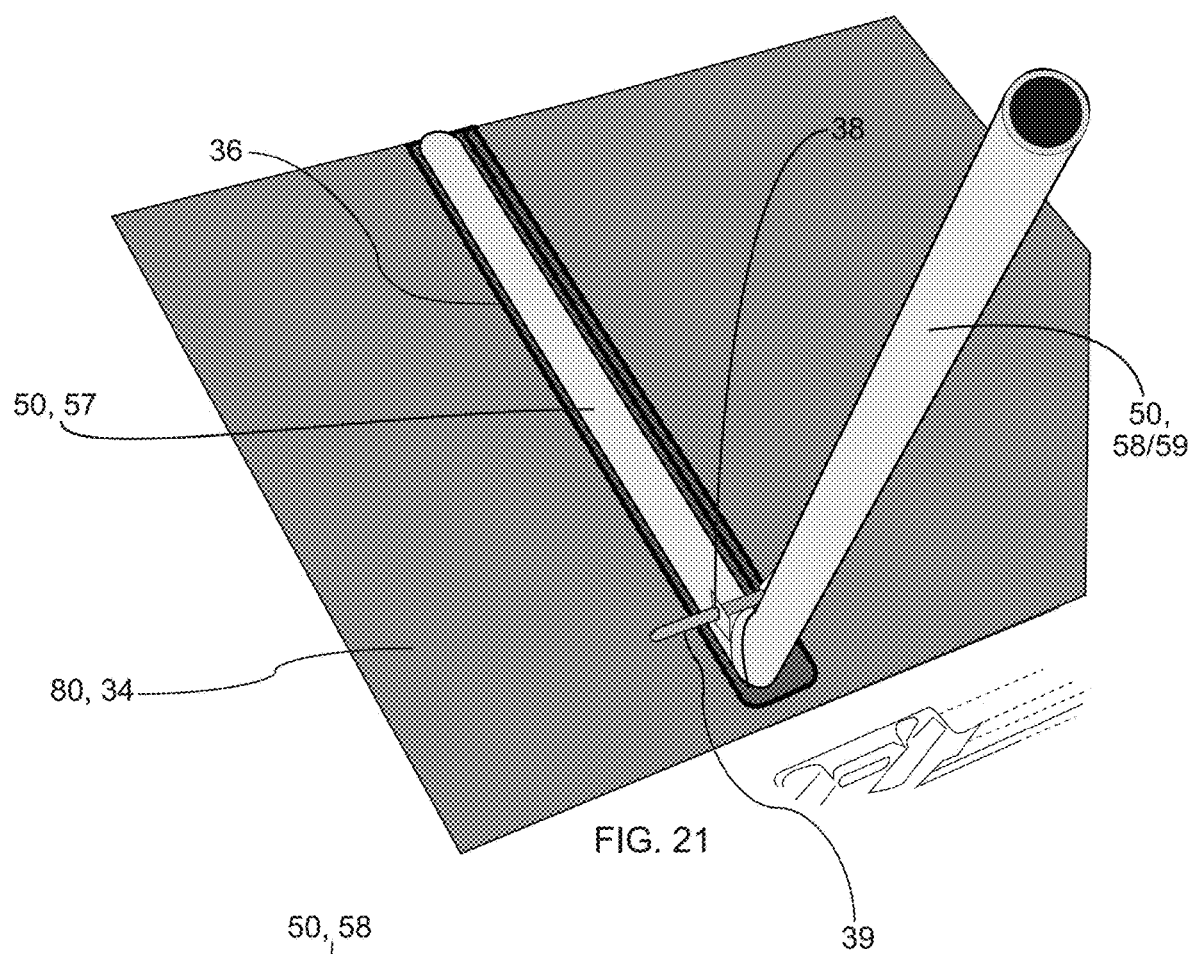

As shown in FIG. 9, each open case component 31 includes an inside surface 32, a bottom section 33, and a peripheral wall 35. Inside surface 32 is at least partially lined with an energy-absorbent (e.g., foam) material 80, and is provided at bottom section 33 with plural parallel grooves 36 (for instance, formed within or delineated by the energy-absorbent material 80 lining 34) in which locking brackets 38 are mounted, each locking bracket 38 having a locking pin 39, such as shown in FIG. 21. As shown in FIG. 21 and other figures, each groove 36 in the foam 80 lining 34 is provided with two aligned locking brackets 38 for keeping a U-shaped bar 50 in place. Each pair of brackets 38 in a given groove 36 defines a "slot" 37 in which fits the U-bottom portion 57 of the U-shaped bar 50.

Figure 3:
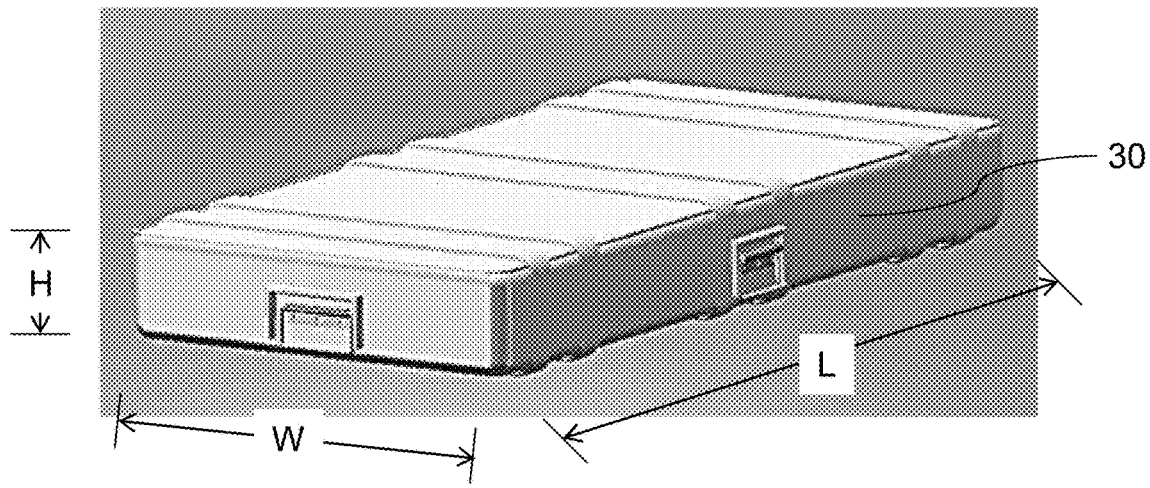
Figure 4:
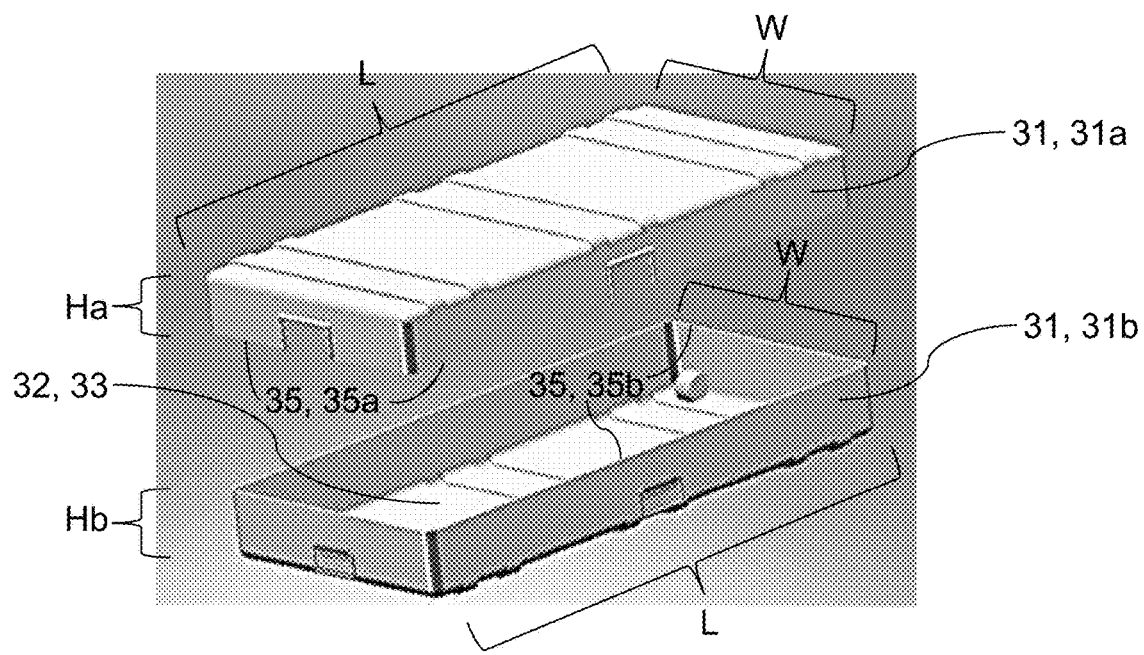

FIG. 8 and FIG. 9 diagrammatically illustrate coupled and uncoupled states, respectively, of case components 31a and 31b with respect to each other. FIG. 3 and FIG. 4 are similarly illustrative of coupled and uncoupled states. When the two open case components 31 are coupled (e.g., for transport purposes), the two solar panels 40, the two U-shaped bars 50, and the inside walls 32 of the case 30 are closely situated inside the case 30. A cross-sectional view of the contents of the closed case 30 may reveal, for instance, a kind of layered configuration. Two adjacent solar panels 40 have their respective solar collection surfaces 46 facing each other. Each solar panel 40 is hinged, via a panel-pivoting mechanism 49, with respect to the corresponding case component 31. Between each solar panel 40's non-collection (opposite) surface 47 and the nearer foam-lined case wall 32 is the U-shaped bar 50 that is hinged (via bar-pivoting mechanism 59) to that solar panel 40.

Some inventive embodiments enhance impact resistance by providing a buffering layer such as an energy-absorptive (e.g., foam) material 80 insert 90, depicted in FIG. 8 and FIG. 9. Foam insert 90 is placed between the respective solar collection surfaces 46 of the adjoining solar panels 40. Furthermore, the present inventors investigated the possibility of placing foam material 80 in the cavity delimited by the solar panel 40's non-collection face 47 (behind the solar panel 40's collection face 46) to enhance solar panel protection. However, due to the higher temperatures resulting from the insulating characteristics of the foam 80 backing, the solar panel 40 produced about 15% less power. Based on this data, it was determined that a backing of foam should not be used for a solar panel 40 while deployed.

When the two open case components 31 are uncoupled (e.g., decoupled for deployment purposes), the case 30 opens and separates into the two open case components 31. In association with each open case component 31, the solar panel 40 (which is hingedly attached via panel-pivoting mechanism 49 to the open case component 31) "pops out," so to speak; that is, the solar panel 40 is rotated or pivoted away from the inside wall 32 of the open case component 31. The base of each solar panel 40 is connected to a pair of rotating hinges 49, one hinge 49 on each side of the solar panel 40. The hinges 49 provide for adjustability of the angles of the solar panel 40, but prevent the solar panel 40 from being removed from the associated open case component 31.

Figure 20:
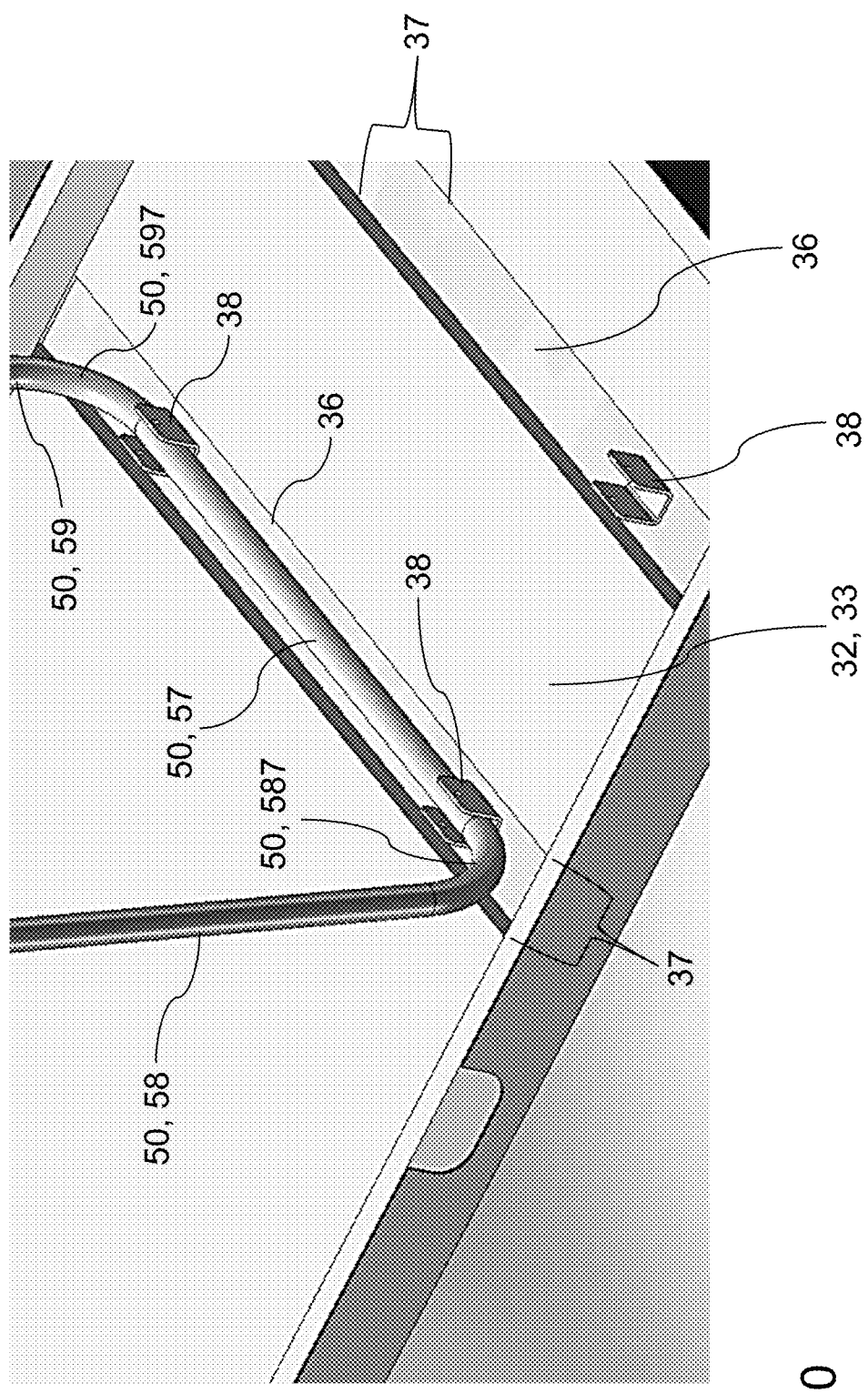
Figure 22:
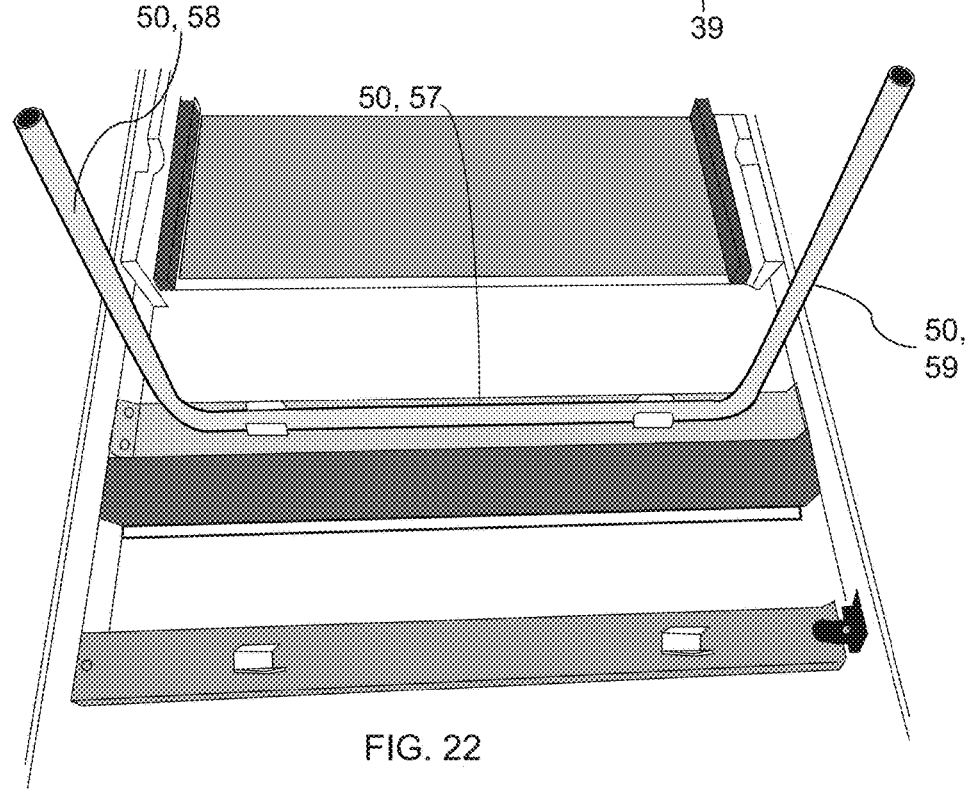
Figure 23:
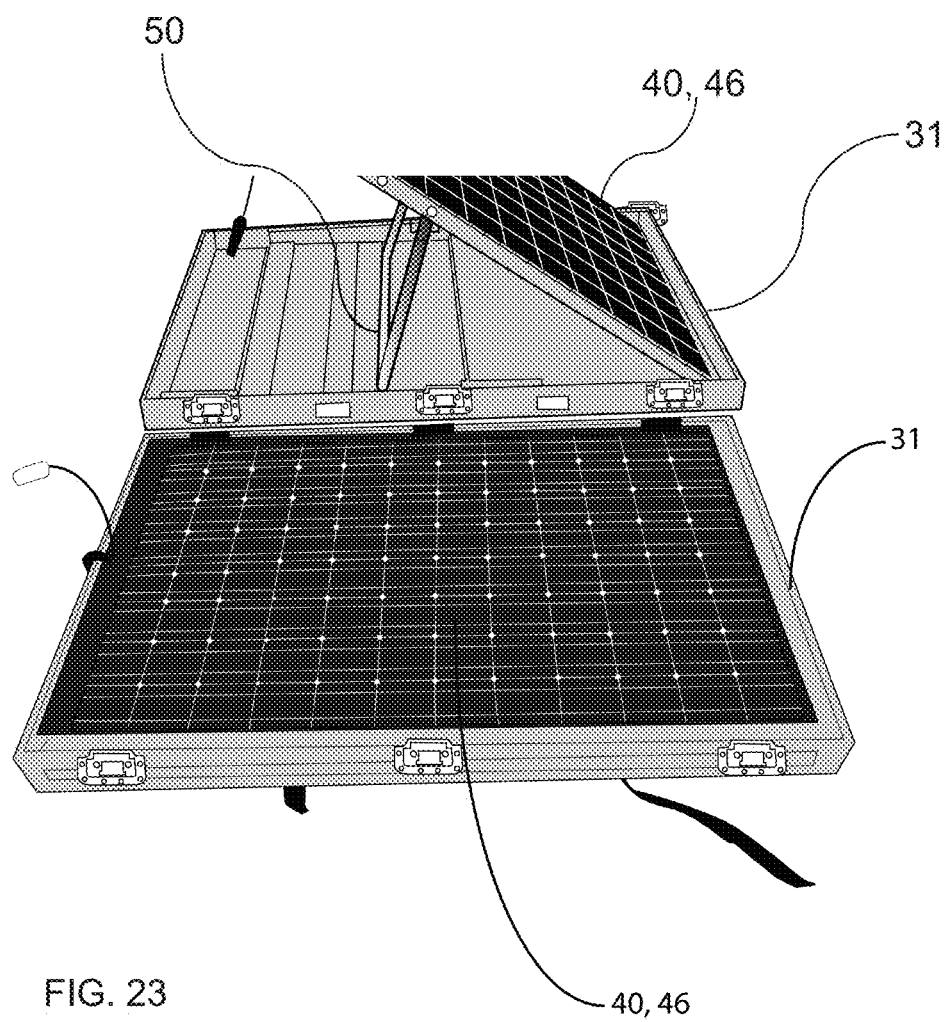

Particularly with reference to FIGS. 20-22, the U-shaped bar 50 has two straight U-side sections 58 and 59, two curved U-corner sections 587 and 597, and a straight U-bottom section 57 forming the U-shape. U-shaped bar 50 lies in a single geometric plane. Curved U-corner section 587 describes a right angle and is between straight U-side section 58 and straight U-bottom section 57. Curved U-corner section 597 describes a right angle and is between straight U-side section 59 and straight U-bottom section 57. Each of U-side sections 58 and 59 is perpendicular to U-bottom section 57. U-corner section 587 connects U-bottom section 57 with U-side section 58. U-corner section 597 connects U-bottom section 57 with U-side section 59. The U-shaped bar 50 props up the solar panel 40 with its U-bottom section 57 sitting in any one of plural slots 37 provided in the bottom surface 33 of the open case component 31, each slot 37 being described by a groove 36, the pair of brackets 38 situate therein, and the pair of locking pins 39 respectively engaging the brackets 38. The rotated/pivoted solar panel 40 is propped up and locked into place using the U-shaped bar 50, which is hingedly attached (via the bar-pivoting mechanism 59) to the solar panel 40. The U-bottom section 57 of the U-shaped bar 50 is slotted and locked (such as by use of locking pins 39, e.g., each pin associated with bracket 38) in the slot 37 defined by plural (e.g., two) aligned brackets 38 (in conjunction with their associated locking pins 39).

Disposition of the U-shaped bar 50 in different slots 37 creates discreet angles of deployment for optimized use in accordance with time and place, e.g., at various geographical regions/locations in the world and at different times of year. The present invention thus affords variability of the angle of inclination of the solar panel 40. This inventive capability is an important design feature for solar collection because, generally speaking, the orientation of a solar panel can affect performance by as much as eighty percent or so, depending on location and time of year.

The present invention's solar module deployment methodology can be applied to a variety of solar modules, including practically all rigid silicon panels. For instance, the present inventors investigated BP380 solar panels and Sanyo 205 solar panels and found them suitable for inventive practice. Inventive deployment is typically part of an entire solar system that includes conventional power components such as a power manager, a battery bank, and DC and/or AC output. The integration of these types of conventional power components in solar collection context is known in the art, and the inventive practitioner will appreciate how inventive solar collection apparatus can be associated with these conventional power components.

Inventive practice lends itself to alternative embodiments. For instance, the sizes and/or orientations of the present invention's case deployment can be changed/altered to meet different panel sizes and/or different deployment angles. As another example, the present invention's "U-Bar" deployment can be modified to have a sectioned base that allows the center section 57 of the U-bar 50 to be removed, essentially propping the panel up with the base poles (analogues of U-bar 50's side sections 58 and 59) locking into parallel tracks, thereby increasing the variability of the deployment angle—e.g., from discrete variability to continuous or more continuous variability.

Figure 2:
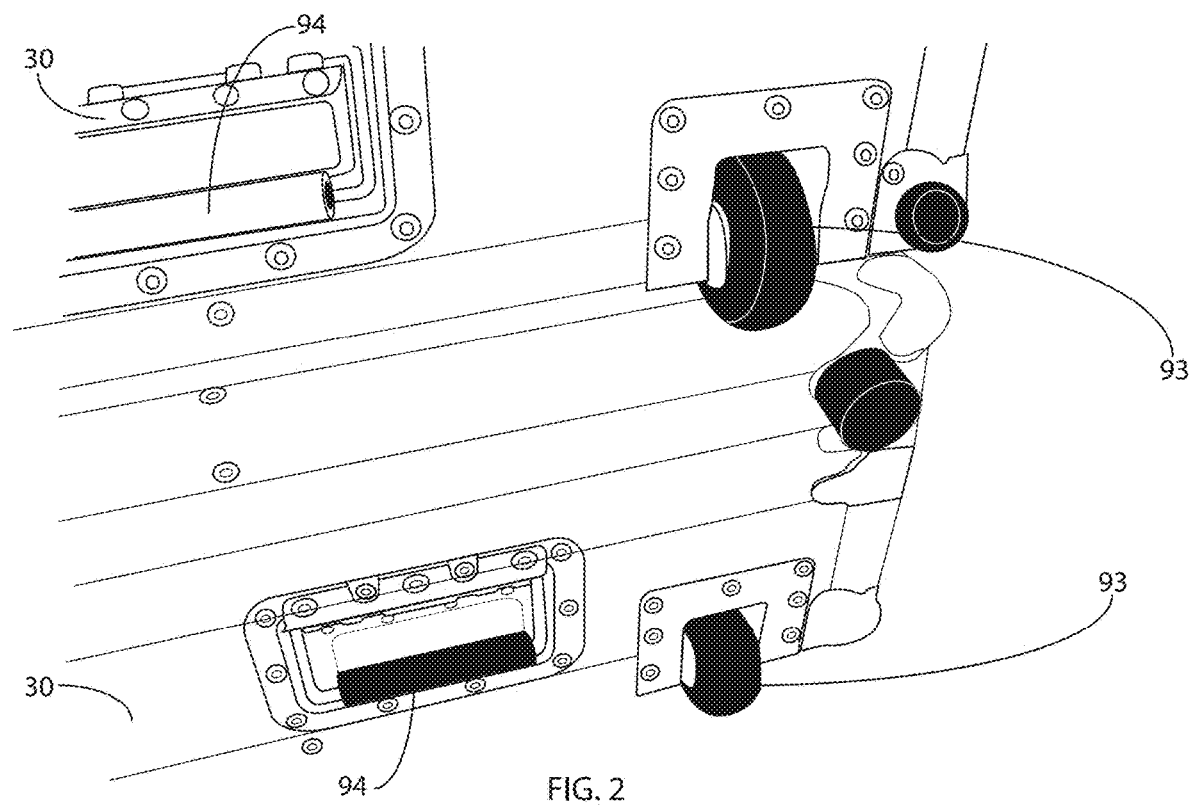
Figure 5:
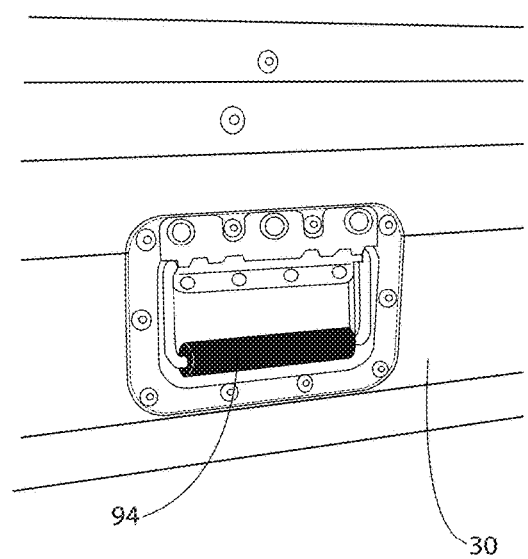

The present invention's solar panel deployment methodology uniquely incorporates shipping and packaging into function. Inventive practice provides for faster and easier deployment of panels and more safe (especially, panel-safe) and reliable ways of operating panels. The inventive system represents a more reliable overall system in transport and use of solar panels. Wheels 93 such as shown in FIG. 2 can be built into the case 30, e.g., one of the open case components 31. Handles 94 such as shown in FIGS. 2 and 5 can also be attached to the case 30 or to either open case component 31. The inventive device is typically lightweight and durable. Yet, the weight of the open case component 31 can help to anchor the solar panel 40 and to protect it against high wind loads. The inventive integration of the shipping container with functional elements decreases setup time, reduces weight, and facilitates deployment.

Since the inventive design integrates casing with operation, the shipping container will not be lost or discarded by deployment personnel, a problem often seen with equipment packaging in the field and commonly leading to system failures. Moreover, inventive practice represents a mobile, rapidly deployable solar system that can be designed to fall into high power ranges, e.g., 100 W-3 kW, which provides sufficient power to run most military equipment. Furthermore, typical embodiments of the present invention minimize moving parts and are otherwise less susceptible to seizing under extreme environmental conditions.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications, and changes to the principles disclosed herein may be made by one skilled in the art without departing from the true scope and spirit of the present invention, which is indicated by the following claims.

What is claimed is:

1. A solar collection method comprising:
providing an apparatus including two U-bars, two solar panels, and a case, each said solar panel having a solar panel back, said case including two half-cases, said case being divisible to obtain separate said half-cases and being unifiable to obtain joined said half-cases, each said half-case having associated therewith one of said solar panels and one of said U-bars, wherein said solar panel is pivotably connected to said half-case and said U-bar is pivotably connected to said solar panel, each said half-case having a half case interior provided with at least two parallel slots;
dividing said case to obtain two separate said half-cases;
with respect to each of the two separate said half-cases, positioning the associated said solar panel at a selected angle-of-inclination for collecting solar energy by performing acts including situating said half-case, pivoting the associated said solar panel so as to be a selected distance from said half-case interior, pivoting the associated said U-bar so as to be a selected distance from said solar panel back, and engaging the associated said U-bar in one of said slots.

2. The solar collection method of claim 1 further comprising unifying said case to obtain two joined said half-cases, wherein said unifying of said case includes:
with respect to each of the two separate said half-cases, performing acts including disengaging said U-bar from said slot, pivoting said U-bar so as to be proximate said solar panel back, and pivoting said solar panel so as to be proximate said half-case interior;
attaching the two separate said half-cases to obtain said unified case.

3. The solar collection method of claim 2 wherein:
said case and said two half-cases each have approximately a rectangular prism geometry and have geometrically the same length and width;
the two said half-cases each have geometrically the same outer rectangular edge;
said attaching of the two separate said half-cases includes adjoining the respective outer rectangular edges of the two said half-cases.

4. The solar collection method of claim 3 wherein said attaching of the two separate said half-cases includes using at least one fastener.

5. A method for solar energy collection, the method comprising:
providing a solar collection device, said solar collection device including a case, two solar panels, and two U-shaped bars, each said solar panel having a solar collection side and an opposite side, said case including two compartments that are attachable to and detachable from each other, each said compartment having an interior surface and at least two slots in said interior surface, each said solar panel being hinged to the corresponding said hollow case component so as to be rotatably adjustable relative to said interior surface, each said U-shaped bar being hinged to the corresponding said solar panel so as to be rotatably adjustable relative to said opposite side, each said U-shaped bar including a U-bottom portion that fits in each said slot, said solar collection device being configurable in a unitary mode or a dichotomous mode;
configuring said solar collection device in said unitary mode, said configuring of said solar collection device in said unitary mode including attaching said compartments to each other to form said case enclosing said solar panels and said U-shaped bars, and disposing each said U-shaped bar at an approximately zero bar angle with respect to said opposite side of the corresponding said solar panel, each said solar panel being disposed at an approximately zero panel angle with respect to said interior surface of the corresponding said hollow case component, the respective said solar collection sides being adjacent to each other;
configuring said solar collection device in said dichotomous mode, wherein said configuring of said solar collection device in said dichotomous mode includes detaching said components from each other and separately situating said components, and positioning each said solar panel at a level position and at least two different slanted positions, wherein according to said level position said U-shaped bar is disposed at an approximately zero said bar angle with respect to said opposite side of said solar panel and said solar panel is disposed at an approximately zero said panel angle with respect to said interior surface of said compartment, and wherein according to each said slanted position said U-shaped bar is disposed at an oblique said bar angle with respect to said opposite side of said solar panel, said U-bottom portion engages one of said slots, and said solar panel is disposed at an oblique said panel angle with respect to said interior surface of said compartment.

6. The method for solar energy collection as recited in claim 5, wherein said configuring of said solar collection device in said unitary mode includes interposing a foam insert between said solar collection sides.

7. The method for solar energy collection as recited in claim 5, wherein said configuring of said solar collection device in said dichotomous mode includes selecting said panel angle and selecting said separate situations of said components in furtherance of optimization of collection of solar energy during operation of said solar collection device.

8. The method for solar energy collection as recited in claim 7, wherein:
said slots are parallel to each other;
each said slot has associated therewith a unique value of said oblique bar angle and a unique value of said oblique panel angle;
said selecting said panel angle includes selecting said unique value of said oblique bar angle and selecting said unique value of said oblique panel angle.

9. The method for solar energy collection as recited in claim 7, wherein:
said case generally describes a closed rectangular prism, said closed rectangular prism being closed at all six geometric faces;
each said compartment generally describes an open rectangular prism, said open rectangular prism being open on one geometric face;
said case and said compartments are each characterized by the same length and width;
each said compartment is characterized by a smaller height than characterizes said case;
each said compartment includes a flat bottom portion and a side wall upwardly bounding said bottom portion, said side wall being characterized by an outer rectangular edge;

said attaching said compartments to each other to form said case includes adjoining the respective outer rectangular edges of said side walls;

said detaching of said compartments from each other includes dis-adjoining the respective outer rectangular edges of said side walls.

10. The method for solar energy collection as recited in claim 7, wherein:

said unitary mode is suitable for storage and transport of said solar collection device;

said dichotomous mode is suitable for operation of said solar collection device.

11. A method for collecting solar energy in a field, the method comprising assembling a solar collection device, transporting the assembled said solar collection device to the field, and collecting solar energy at at least two different locations in the field, said solar collection device including two containers, two solar panels, and two U-shaped support members, each said container having an inside container surface and an outside container surface and at least two aligned brackets mounted on said inside container surface, each said solar panel having a collection surface and a non-collection surface;

said assembling including associating each said container with one of said solar panels and one of said U-shaped support members, said associating including pivotably connecting each said solar panel to a said container and pivotably connecting each said U-shaped support member to a said solar panel, each said solar panel being capable of being pivoted to panel positions whereby said non-collection surface is close to and variably distanced from said inside container surface of the connected said container, each said U-shaped support member being capable of being pivoted to member positions close to and variably distanced from said non-collection surface of the connected said solar panel;

said transporting including pivoting each said U-shaped support member to a member position close to said non-collection surface of the connected said solar panel, pivoting each said solar panel to a panel position whereby said non-collection surface is close to said inside container surface of the connected said container, and joining said containers to each other so as to enclose said solar panels and said U-shaped support members arranged so that each said U-shaped member is between a said non-collection surface and a said inside container surface and so that said collection surfaces are proximate and face each other;

said collecting of solar energy including separating said containers from each other so that each said container remains associated with a said solar panel and a said U-shaped support member, placing said containers so that the respective said outside container surfaces sit upon terrain at different said locations in the field, and setting the respective said solar panels for collection of solar energy, each said solar panel being set so that said collection surface is disposed at a selected angle relative to said terrain, said setting of each said solar panel including pivoting said solar panel from a panel position whereby said non-collection surface is close to said container to a panel position whereby said non-collection surface is distanced from said container, pivoting said U-shaped support member from a member position close to said non-collection surface of the connected said solar panel to a member position distanced from said non-collection surface of the connected said solar panel, and slotting said U-shaped support member in a said alignment of at least two said brackets.

12. The method for collecting solar energy of claim 11 wherein said transporting further includes, prior to said joining of said containers, introducing an energy-absorbent layer between the respective said collection surfaces of said solar panels.

13. The method for collecting solar energy of claim 11 wherein each said U-shaped support member includes two U-side portions and a U-bottom portion, said U-side portions being for effecting said pivotable connection of said U-shaped support member to the connected said solar panel, said U-bottom portion being for effecting said slotting of said U-shaped support member in a said alignment of at least two said brackets.

14. The method for collecting solar energy of claim 11 wherein said collecting of solar energy further includes re-setting at least one said solar panel for collection of solar energy, said solar panel being re-set so that said collection surface is disposed at a different selected angle relative to said terrain, said re-setting of said solar panel including pivoting said solar panel to a panel position whereby said non-collection surface is at a different distance from said container, pivoting said U-shaped support member to a member position at a different distance from said non-collection surface of the connected said solar panel, and slotting said U-shaped support member in a different said alignment of at least two said brackets.

* * * * *